United States Patent [19]

Breed

[11] 4,229,805
[45] Oct. 21, 1980

[54] MAGNETIC BUBBLE-DOMAIN DEVICE

[75] Inventor: Dirk J. Breed, Eindhoven, Netherlands

[73] Assignee: U.S. Philips Corporation, New York, N.Y.

[21] Appl. No.: 867,149

[22] Filed: Jan. 5, 1978

[30] Foreign Application Priority Data

Aug. 24, 1977 [NL] Netherlands .......................... 7709312

[51] Int. Cl.² ............................................. G11C 19/08
[52] U.S. Cl. ....................................... 365/2; 365/19; 365/39
[58] Field of Search ............................................ 365/2

[56] References Cited

U.S. PATENT DOCUMENTS 4,041,447  8/1977  Feueranger et al. ................... 365/39

OTHER PUBLICATIONS

Handbook of Chemistry & Physics–38th Edition–Published by Chemical Rubber Publishing Co., Clev., Ohio, pp. 2250–2259.

*Primary Examiner*—James W. Moffitt
*Attorney, Agent, or Firm*—Marc D. Schechter

[57] ABSTRACT

A magnetic domain device comprising a layer of a magnetic material for the formation of magnetic domains, for example bubbles, under the influence of a bias magnetic field and a propagation structure with magnetically operating elements for driving the magnetic domains by the sequential formation thereon of preferred positions for the domains. The current conductors used to propagate the domains, either meander conductors or rotary field "coils", are arranged on a layer of silicon, so that the heat developed in the current conductors can readily be carried off by the silicon which exhibits a good thermal conductivity.

20 Claims, 14 Drawing Figures

PRIOR ART

PRIOR ART

MAGNETIC BUBBLE-DOMAIN DEVICE

BACKGROUND OF THE INVENTION

The invention relates to a magnetic bubble-domain device comprising a plate of a magnetic material in which magnetic domains can be sustained by a field from a bias magnetic field generator, which field is disposed transverse to the plate. This device furthermore comprises at least one current conductor for locally forming selective preferred positions for the magnetic domains under the influence of different currents in the current conductor, so that the device is suitable for controlling a magnetic domain by means of a sequence of currents. As a result, the domain is drivable along a predetermined path in the magnetic plate.

In magnetic domain technology various control techniques have become customary. Thus, the domains can be influenced for a short time only, for example in a generator element, a switching element, or a domain destruction element. Or, they can be driven along a sequence of preferred positions which constitute a path. For the last-mentioned case different drive techniques have been adopted, for example those employing a so-called rotary field and those in which the bias magnetic field is influenced. A device of the first-mentioned type is known from U.S. Pat. No. 3,848,209. The known device comprises plates of a suitable and sufficiently rigid material, namely epoxy, on which parallel copper conductors are disposed. The heat developed by the currents in the copper conductors can only be carried off to a limited extent by the epoxy material. At a specific dissipation the temperature is then apt to become too high.

SUMMARY OF THE INVENTION

An object of the invention is to facilitate heat removal from conductors in a magnetic bubble domain device by the choice of a material having favorable heat conduction and other features associated with the use of the material in such a device. These objects are achieved by the invention, which includes a plate of silicon which is arranged substantially parallel to the plate of magnetic material. The current conductor is then at least partly structurally combined with the silicon plate so as to carry off heat which is developed by the current in the conductor through heat transfer to and heat conduction in the silicon plate. Both the intrinsic properties of silicon and the technologically attainable qualities of such a layer signify a major improvement with respect to epoxy and similar materials. As an example, silicon exhibits a good thermal conductivity. Furthermore, it appears to be possible to manufacture very flat silicon plates. Electrical insulation of a conductor relative to a silicon plate is also readily achievable, for example by means of a thin oxide layer. "Pinholes" in the insulation layer are unlikely to give rise to problems, because generally small voltage differences prevail and the leakage resistance is comparatively high. In this respect "structurally combined" is to be understood to mean such a combination as is realized by planar techniques such as sputtering, vapor deposition, precipitation or crystal growing.

Preferably, the sequence of currents forms a continuous sequence of preferred positions for the domain, which preferred positions define the path. Also if a domain is to be influenced repetitively, for example in the case of a switching element, the energy dissipation problem becomes more pronounced and therefore the invention provides an advantageous solution to the problem of heat removal.

Preferably, the current conductor comprises a meander-shaped section which amplifies or attenuates, by means of an electric current therein, the bias magnetic field in alternating meander loops. Such a meander-shaped conductor is used for driving magnetic domains along a path which extends at least partly along the conductor. A device which uses such a conductor for driving domains is a so-called current access device. This is in contrast to the device in U.S. Pat. No. 3,848,209 which relates to so-called field access devices. Current access in itself is particularly suitable for attaining a high bit frequency, for example in the presentation of domain information to a detector element. However, the dissipation then increases rapidly with the drive frequency and because until now the meander conductor was directly arranged on the plate of a magnetic material, the temperature rise in said plate was apt to become prohibitive. The maximum permissible temperature is dictated by the fact that the stability range for magnetic domains exists over a limited temperature range only. By the use of the invention a domain memory employing current access can now be realized with a higher information capacity, or conversely with a higher frequency (because the dissipation increases with the drive frequency).

On the other hand, in the case of field access devices in accordance with the previously cited United States Patent, the two epoxy plates constitute a coil in that the ends of the copper conductor are each time interconnected by connectors. Furthermore, there is provided a second similarly constructed coil, so that they enclose the same internal area. The magnetic fields which can be generated by the two coils have a difference in orientation of 90° in the internal area. By energization with sinusoidal currents which are phase-shifted 90° relative to each other, a sufficiently uniform rotary magnetic field is produced in the internal area. In the internal area plates with magnetic domains, for example bubble domains, are arranged so that the rotary magnetic field is parallel to the plates. Said domains can be driven along a domain guidance structure by the rotary magnetic field, which structure for example consists of T-I-permalloy elements and variations thereof. In this respect it is preferable if the silicon plate contains a two-dimensional area in which there are arranged a plurality of current conductors which are at least substantially parallel to each other and which are structurally combined with the plate of silicon, so as to generate a substantially uniform magnetic field, which is oriented at least substantially parallel to and in the plate of magnetic material at the location of the two-dimensional area, by means of coexistent and equally directed currents in the conductors. By means of such a conductor array it is readily possible to produce a reasonably homogeneous and tangentially oriented magnetic field. The geometry can be obtained by means of a simple mask. The formation of current conductors on a silicon substrate is known per se, but in accordance with the invention such conductors are used in a very advantageous manner for driving magnetic domains. An advantage of such silicon plates is the high degree of flatness achievable by means of appropriate techniques which previously appeared to be necessary in the manufacture of integrated circuits. These techniques enable such magnet coils to be manufactured easily, cheaply and with a high yield. Furthermore, it is possible to manufacture all kinds of special patterns for the conductors, such as conductors of mutually different cross-section. Thus, conventional coils may be combined with coils arranged on a silicon plate in accordance with the invention.

Preferably, the silicon plate comprises two sets of current conductors within the two-dimensional area. Each set includes conductors which are substantially parallel to each other and which are structurally combined with the second plate of silicon. The two sets are arranged crosswise relative to each other so as to generate a rotary magnetic field in the plane of the plate of magnetic material at the location of the two-dimensional area, which field is at least substantially spatially uniform, by means of time-dependent electric currents in the respective sets. If desired, a suitably conductive plate, for example copper, which acts as a field mirror, may be arranged on the other side of the plate of magnetic material. The high degree of flatness of a silicon plate furthermore has the advantage that field components in the transfer direction are small in the central area. If desired, it is thus possible to obtain a highly flat and compact arrangement.

On the other hand, it is favorable if the silicon plate comprises a first two-dimensional area in which there is arranged a first plurality of current conductors, which are at least substantially parallel to each other and which are structurally combined with silicon plate. A second silicon plate is also provided which has a second two-dimensional area in which there is arranged a second plurality of current conductors which are at least substantially parallel and which are structurally combined with that second silicon plate. The size and location of the first and the second two-dimensional areas and the first and second pluralities of conductors, and the directions of the first and second pluralities of current conductors are chosen, so as to generate a substantially uniform magnetic field which is oriented substantially parallel to and in the plate of magnetic material. The latter plate is disposed between the two silicon plates. The magnetic field is generated at the location of the two-dimensional areas by means of coexistent currents, which are of equal magnitude but of opposite direction within the first and within the second plurality of conductors. The two plates of silicon within the first and second two-dimensional areas each preferably comprise two sets of current conductors which are at least substantially parallel to each other and which are structurally combined with the relevant silicon plate. These two sets are each arranged crosswise relative to each other so as to generate a substantially uniform rotary magnetic field at the location of the two-dimensional areas in the plane of the plate of magnetic material by means of time-dependent currents in the respective sets, the fields of the two sets of current conductors cooperating at the location of the plate of magnetic material. Under certain conditions it is thus readily possible to obtain a large working volume by appropriately spacing the two silicon plates.

It is favorable if the silicon plates contain sets of conductors which locally cross each other in at least two locations so as to generate rotary magnetic fields with mutually different directions of rotation in the plate of magnetic material and at the location of the crossings by means of time-dependent currents in the sets. If thus different directions of rotation are permissible, the conductors may take the form of conductors which meander between different ones of the two-dimensional regions. As a result of this the length of the conductors can be increased. In some cases the resulting increase in load resistance may enable a better matching to a current pulse generator to be obtained. Furthermore, such arrangement frequently also enables the number of connections to be limited, resulting in a simpler organization. In many cases a further advantage may be that the external field is comparatively small owing to the large transverse dimension of the plates. Thus, a high efficiency in respect of energy can be obtained.

In accordance with the foregoing the invention may be advantageously employed in both field access and current access devices. Furthermore, as described in application Ser. No. 754,962, filed Dec. 28, 1976, now U.S. Pat. No. 4,157,591 both field and current control of magnetic domains in may be employed a single plate of a magnetic material. It is evident that a silicon plate as disclosed can be employed to carry the current conductors of both control mechanisms.

It is favorable if the plate of magnetic material comprises a two-dimensional region for accommodating a group of magnetic domains which are regularly arranged in accordance with matrix axes and that part of the current conductor comprises at least two sections which extend parallel to a first matrix axis for driving at least one subgroup of the group of domains, which subgroup is disposed between the conductor sections, in a direction transverse to the first matrix axis by the sequence of currents in the sections. Thus, as an example, each loop of a meander conductor in a current access device may be oblong in the direction of the matrix axes in order to increase the bit frequency. Each meander loop may then comprise a number of preferred domain positions.

On the other hand it is favorable if the group constitutes a domain lattice utilizing repellent forces between adjacent domains. Such domain lattices have become known recently and enable a very high information density to be obtained on the plate of magnetic material. Such a lattice is for example discussed in an article by B. A. Calhoun et al, Column access of a bubble lattice, IBM. J. Research and Development, July 20, 1976, 368. The domain information may for example be determined by the magnetization configuration of the domain wall. According to Calhoun the entire lattice is driven by consecutive energization of a plurality of conductors which are arranged parallel to the matrix axes. The matrix axes may be the chief directions of the hexagonal lattice. These conductors may again be structurally combined with a silicon plate in accordance with the invention. Serial extraction of information from the domain lattice can then be realized with a meander conductor.

It is favorable if there are provided magnetically operating means in the form of elements of a ferromagnetic material for the formation of preferred domain positions thereon in cooperation with the currents, and that the elements are structurally combined with the silicon plate. In the manufacture of a magnetic domain device mainly two faults occur. On the one hand the magnetic layer may exhibit crystal defects and contaminations. This frequently results in magnetic domains not being able to pass such a point (pinning point). On the other hand, faults may occur in the magnetic elements (for example in the case of a field access device, T and I-elements). By arranging the magnetic elements together with the previously mentioned current conductors on a silicon plate the two categories of faults are separated. Obviously, this also applies to faults (short circuits, interruptions) in the current conductor(s). It is now no longer necessary to combine a fault-free propagation structure with a defective layer of magnetic material or vice versa. It is even conceivable that by a lateral shift the pinning points may be positioned at an unimportant location with respect to the propagation structure.

Suitably, the plate of magnetic material is substantially a single-crystal. As a result of this use can be made of various favorable properties associated with integrated circuit technology. As an example, very flat silicon layers can be formed.

Alternatively, it is favorable if the plate of magnetic material is a polycrystalline material. This is another advantageous fabrication method.

It is favorable if a circuit for controlling current pulses in at least one of the current conductors takes the form of an integrated circuit on the plate of silicon. As an example, the generator constitutes an integrated circuit in a manner known per se. It can be formed together with the current conductors so as to reduce the number of connections.

Preferably, there is provided a magnetically operating detector element with an input connected to the path for magnetic domains, which detector element is structurally combined with the silicon plate. As an example, the detector element may be manufactured with the same technology and the same processing step as the magnetically operating elements of the propagation structure.

It is favorable if furthermore there is provided an electrically operating detection circuit of which an input is electrically connected to an output of the detector element so as to supply a detection signal to an electrical output of the detection circuit, which detection circuit is structurally combined with the silicon plate as an integrated circuit which is formed on the plate. Thus, manufacture is also simplified and the number of connections reduced. It is furthermore favorable (1) if the current conductor comprises a current loop of a domain generator element which loop is structurally combined with the silicon plate, (2) if the current conductor comprises a current loop of a domain switching element, which loop is structurally combined with the silicon plate, so that a domain is selectively drivable to one of at least two path branches issuing from the element, and (3) if the current conductor includes a current loop of a domain destruction element, which loop is structurally combined with the silicon plate. This yields a further advantageous increase in the number of functions accommodated on the silicon plate. In these cases it is generally also advantageously possible to make use of the easy removal of heat in and the suitable technological qualities of the silicon plate.

It is furthermore favorable if an information processing device for the processing of domain information is structurally combined with the silicon plate as an integrated circuit formed on the plate, and if there is provided an information connection between a connection point of the information processing device and a device for access to a magnetic domain path. This again results in a higher integration level.

BRIEF DESCRIPTION OF THE DRAWINGS

The invention will be described in more detail with reference to the Figures.

DESCRIPTION OF THE PREFERRED EMBODIMENTS

Figure 1:
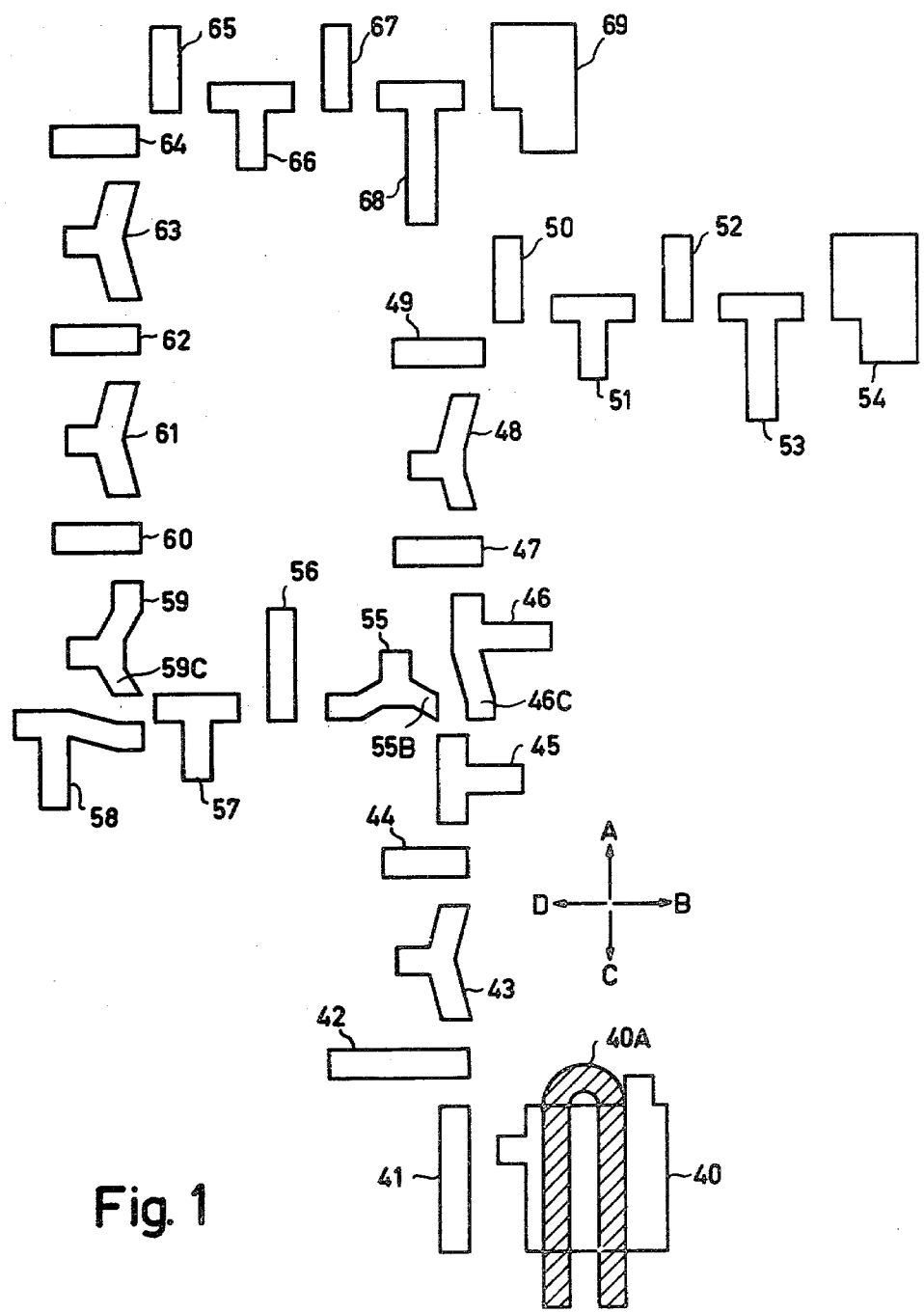
FIGS. 1 through 4 show four different drive structures for magnetic domains.

FIG. 1 shows a first drive circuit for magnetic domains in a so-called field access device. Such structures are known per se in magnetic domain technology. In accordance with prior-art technology the discrete elements shown consist of a ferromagnetic material, for example permalloy, and are deposited onto the ferrimagnetic layer, for example by sputtering. The last-mentioned material is for example a doped yttrium iron garnet layer, but this layer is not shown in this Figure. In accordance with the invention the permalloy elements may also be arranged on a silicon plate which is disposed along the plate of a ferromagnetic material. On the source element 40 there is always a parent domain from which a domain issues every clockwise period of the rotary magnetic field. For this purpose the source element in the present example comprises a substantially square permalloy element and in addition a current loop 40A, which is shown hatched. In a specific phase of the rotary magnetic field, for example when the field has the orientation of arrow A, the current loop is energized so that the background field in the inner area is amplified. This enables a bubble domain which extends between the elements 40 and 41 to be split-off more easily. Split-off domains are then consecutively carried off to the domain destruction element 54 via the elements 41, 42 . . . 45, 55, 46 . . . 53. Driving is effected in that successively preferred positions are formed on the ends of the permalloy elements which are oriented in accordance with the arrows of the system of axes. When the rotary field is oriented in accordance with the arrow C there is for example a preferred position at 46C and on correspondingly oriented ends of the other elements. If there is a domain at position 55B and the direction of rotation of the field is counter-clockwise for at least 7/4 period and at the most 10/4 period, the domain will reach domain position 59C. Upon continuation of the clockwise rotation the domain reaches the domain destruction element 69 via the elements 59 . . . 68. Such an arrangement may be extended by further diverging switches, converging switches, storage loops and detection elements so as to enable operation as a storage and/or processing device for binary information. The circuit arrangement shown comprises a current-controlled generator having passive elements only. The switch means and the annihilators may also be provided with current control, for example in order to increase the immunity against interference.

Figure 2:
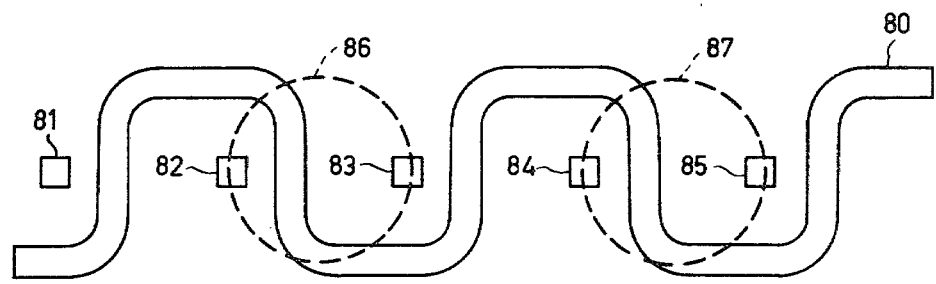

FIG. 2 shows a known drive structure for magnetic domains in a so-called current device. Here, the system comprises small permalloy elements 81–85 and a vapor-deposited current conductor 80 with meander loops on the plate of magnetic material. In certain cases this current conductor may also be made of permalloy. In the last-mentioned case the asymmetrically arranged elements 81–85 may also be arranged to adjoin the bends of the meander conductor, as protuberances thereof. The period of the meanders is approximately twice the diameter of the two bubble domains 86, 87, which are shown dotted. In the rest condition (no current through conductor 80) the domains are preferably oriented so that their edges coincide with the permalloy elements. When there is a current in the conductor, the domains move to a location where the bias magnetic field is low. If the current is sustained for half a period, so that at the location of the elements 82, 84 the field is attenuated, the domains will pass to those meander loops and will have moved half a period of the meander conductor to the left at the end of the half period. During a subsequent current half period in the opposite direction the domains are once again driven to the left by half a period of the meander conductor. Such a structure can again be completed in known manner with generators, switches and domain annihilators for processing the information contained in the domains within a drive path. This is not further illustrated for the sake of simplicity.

Figure 3:
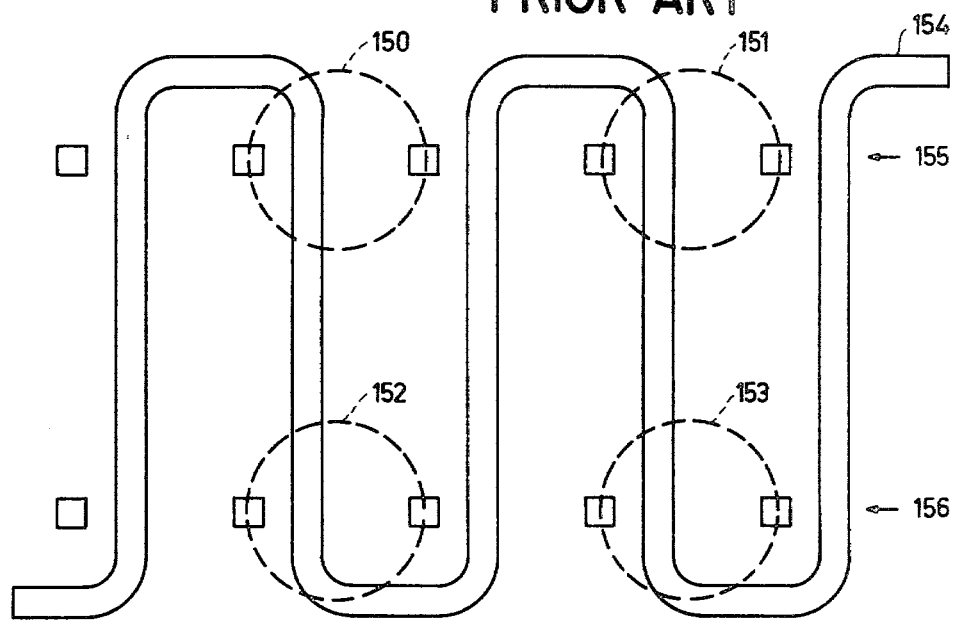

FIG. 3 gives a third drive structure, starting from FIG. 2. The domains 150–153 are arranged in accordance with vertical matrix axes, parallel to the limbs of the meander loops. They are driven along the rows of permalloy elements 155, 156 in the direction of the arrow by alternately directed current half-periods in the meander 154. The center-to-center distance between two domains is at least two domain diameters. The influence of the repelling forces between two domains is sufficiently small in order not to influence the domain paths.

In FIGS. 1–3 the information may be represented by a domain for example corresponding to the logic value "1" and a void domain position corresponding to the logic value "0". Owing to the minimal interaction between domains this information can then be preserved. In certain cases the distances between adjacent domains may be greater or smaller. The number of domain positions per extended meander bend may then be three or more. Furthermore, the directions of driving may differ from each other by an appropriate arangement of the permalloy elements.

Figure 4:
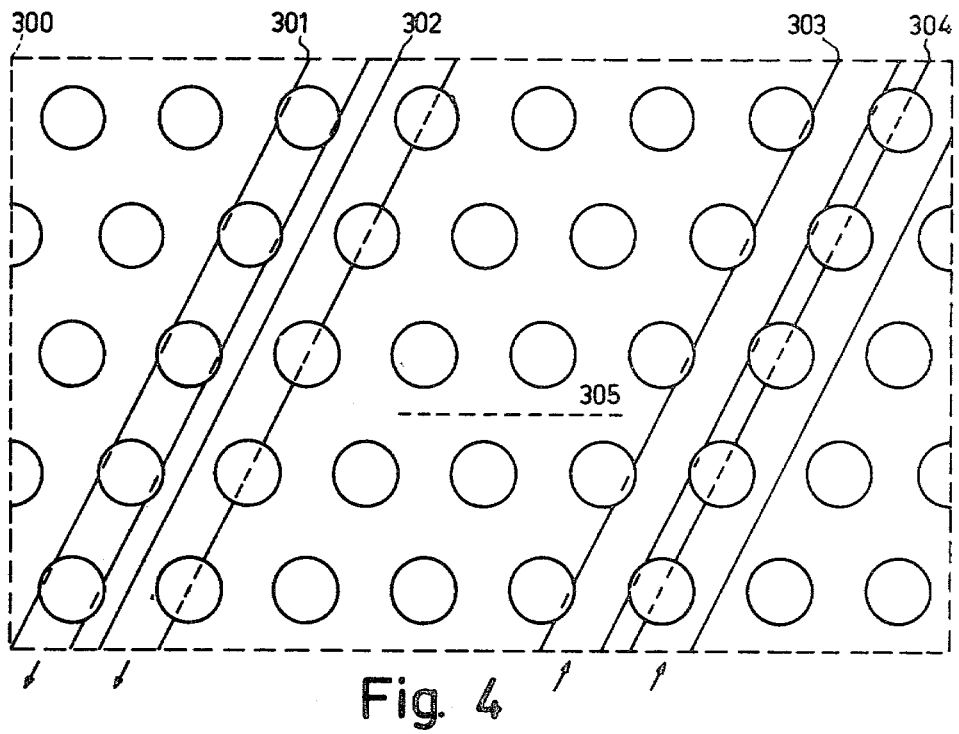

FIG. 4 gives a fourth known drive structure. The circular domains are arranged in accordance with a hexagonal lattice. The information embodied therein may, for example, manifest itself in the different structure of the bounding wall between the domain and background region. The layer of magnetic material may also comprise two sublayers which together constitute a structural unit. A domain in the first sublayer may or may not be accompanied by a coincident domain in the second sublayer, so as to form a logic "0" or "1" respectively. The spacing between the domains is now such that the repelling force between adjacent domains ensures that a regular lattice is maintained. For this, the spacing may be smaller than the spacing in the case of the independent domains in FIG. 3. On the other hand, no stabilizing permalloy elements are now provided. Pairs of conductors 301/302, 303/304 are arranged parallel to one of the principal directions of the lattice (matrix axes). In the present example the spacing between the conductors 301 and 303 equals $4\frac{1}{2}$ elementary periods of the lattice. The conductors 301 and 303 are electrically connected in series so as to conduct currents in accordance with the direction of the arrow or exactly in the opposite direction. Similarly, the conductors 302/304 are connected in series. The currents in the conductors can now drive the domain lattice as a whole, stability being ensured by the repelling forces. Additional stabilization can be obtained by "dams" which extend at 60° with the conductors, and across which the domains cannot pass. Such a dam is consequently parallel to the dotted line 305. Serial extraction of the information is possible by arranging a system in accordance with FIG. 2 parallel to the conductors 301 . . . (the dams are then locally interrupted). In accordance with the invention the conductors 301 . . . may be disposed, on a silicon plate so as to improve the removal of heat. The dams may be disposed on the plate of the magnetic material. Accurate positioning is then necessary in one coordinate direction only.

Figure 5:
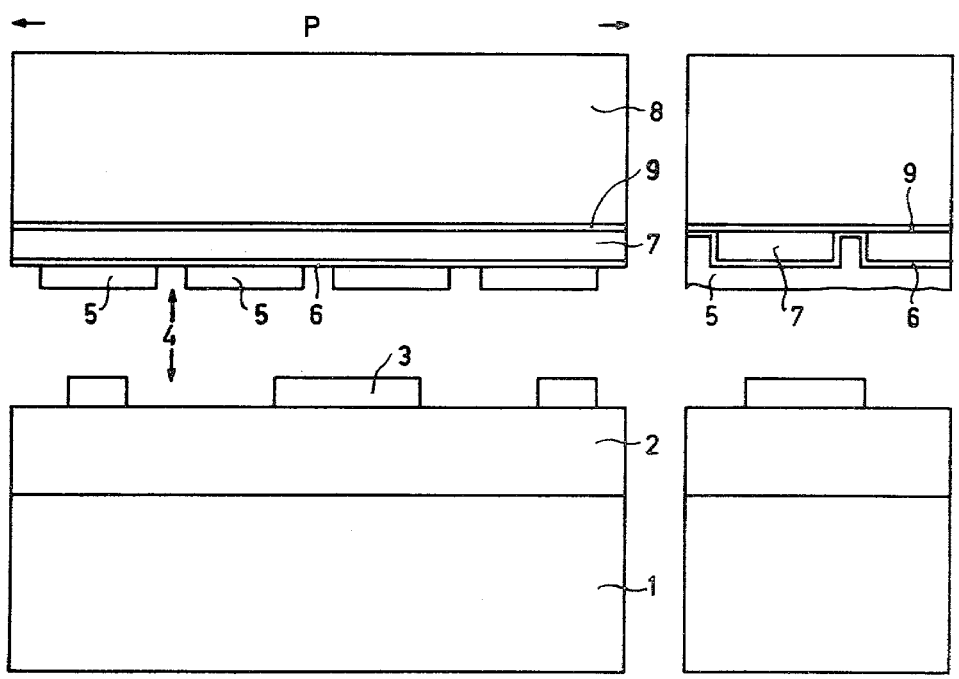
FIGS. 5 through 7 show various cross-sections through domain devices according to the invention.

FIG. 5 shows two cross-sections through a device according to the invention, in particular for field-access operation. The device comprises a substrate 1 which serves for reinforcement. The substrate, for example, takes the form of a gadolinium-gallium garnet single-crystal. The thickness of layer 1 is for example of the order of 1 mm. The layer 2 is of a magnetic material and is adapted to accommodate domains in the form of bubbles. The material is, for example, a doped yttrium-iron garnet (La, Ga). The thickness of this layer is, for example, 5 microns, and is of approximately the same order of magnitude as the cross-section of the more or less cylindrical domains. The elements 3 are for example the ferromagnetic elements mentioned with reference to FIG. 1. These elements are, for example, made of permalloy and have a layer thickness of, for example, 1 micron. Their smallest details are of the same order of magnitude as the cross-section of the domains, or slightly smaller. In FIG. 1 an I-shaped element would for example measure $4 \times 12$ microns. Such elements may be applied with the aid of photolithograhy and etching or RF-sputtering. Additional conductors of the type of the conductor 40A in FIG. 1 are not shown for the sake of simplicity.

The device further comprises a silicon layer 8. The layers 1 and 8 are substantially parallel. Silicon is a comparatively good heat conductor. The following table gives the thermal conductivities in W/m°K. for some substrate materials.

Glass: 1.4
Epoxy (maximum): 4
Gadolinium-gallium garnet: 9
$Al_2O_3$: 40
Silicon: 148

Thus, silicon is a better heat conductor than many other substrate materials, including epoxy. For this last-mentioned material, the volume above is the highest value that has been found for other varieties of epoxy the thermal conductivity is 3–100 times lower. The layer 8 may take the form of a single crystal manufactured by means of techniques used in the manufacture of integrated circuits. The layer 8 has a thickness of, for example, $\frac{1}{4}$ mm. The layer 9 is an insulator layer for example of silicon oxide ($SiO_2$). Applying such a layer is also a commonly used technique in semiconductor fabrication technology. The thickness of such a layer is a few tenths of a micron. The layer 7 is, for example, a layer consisting of strip-shaped conductors, for example of aluminum. In the left-hand cross-section these strips extend parallel to the plane of drawing. Layer 6 is an insulating layer of the same qualities as the layer 9. The layer 5 is a similar layer of strip-shaped conductors as the layer 7. In the left-hand cross-section, the last-mentioned strips 5 extend perpendicular to the plane of the drawing. By energizing of these two sets of conductors a rotary magnetic field can be produced in the plane of the plate 2 for operating an arrangement in accordance with FIG. 1. Sometimes it is advantageous to cover the side of the layer 5 which is remote from the layer 8 with an insulating layer such as the layers 6, 9. The distance 4 between the layers 3 and 5 is fixed. This distance may be fixed by known fixation means, for example at a value of 20 microns. If, in the case of a different configuration of the semiconductor layers, use were made of current access for the domains (also see FIG. 7), this distance would be selected smaller, for example in the range between 0.1 and 0.3 micron. The plate of magnetic material and the plate of silicon can then be fixed to each other in an advantageous manner by means of an adhesive, and a sputtered $SiO_2$ layer for defining the distance.

Comparison of the thermal conductivities reveals that removal of heat by the layer 8 is much easier than when the current conductors were arranged on the layer 2. The thermal conductivity of silicon is 15× greater than that of gadolinium-gallium garnet. On the other hand, removal of heat at the rear of the layer 8 will exhibit specific heat transfer characteristics. The ratio of the thermal conductivity and the thermal transfer coefficient determines the degree of improvement obtained in this respect.

In the configuration described the distance 4 is selected to be in conformity with the desired field homogeneity. If the spacing between the strips 5 is 1 micron, and the requirements in respect of the field homogeneity, in the case of flat plates, are not too stringent, the distance 4 may for example be reduced to 2 microns.

The right-hand part of FIG. 5 gives a cross-section through the device in a direction perpendicular to that of the left-hand part of FIG. 5. The changed arrangement of the strips in the layers 5, 7 is clearly visible.

Figure 6:
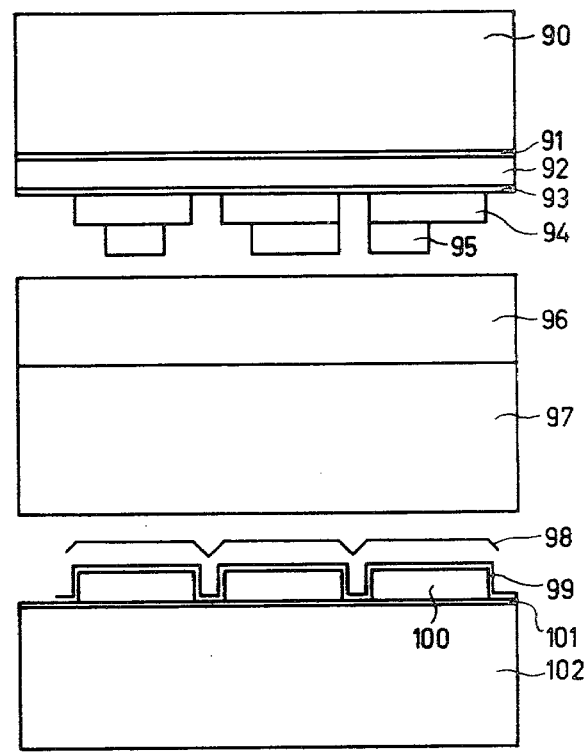

FIG. 6 shows another cross-section through a device according to the invention, starting from FIG. 5. On both sides of the domain layer of magnetic material 96 and the reinforcing substrate layer 97, a silicon layer (90 and 102 respectively) is now located, each having two pairs of conductor-strip sets (92, 94, 98, 100) and insulating intermediate layers (91, 93, 99, 101). When the conductor strips 92 and 98 are now energized so that they augment each other's effect in the central area of the Figure, the magnetic field thus produced is virtually limited to the gap-like space between the two silicon plates. The self-inductance of the sets of strips is also small, so that they can be driven with a high frequency. The same applies to the set of strips extending in the other direction. Such a configuration can be realized partly by arranging one silicon plate with conductors plus domain layer between copper plates, so that so-called field mirrors are obtained. However, such an arrangement does not function at lower frequencies, for example if the field is to have a fixed orientation for some time. Alternatively, it is possible that each of the plates 90, 102 carries only one set of conductors (i.e., for example the layers 92 and 100 respectively), which then each produce one of the field components. The addition of two copper plates as field mirrors may then be favorable. In FIG. 6 the positions of the plates 90, 102 relative to each other need only comply with wide tolerance limits. On the strips 94 selective permalloy elements 95 are disposed, so as to form the preferred domain positions in conjunction with the direction of the rotary magnetic field. Thus, the central area of the Figure exclusively contains homogeneous layers 96, 97, so that they may be disposed at more or less arbitrary positions and consequently have a wide tolerance. If desired, mechanical means, not shown, may be provided in order to obtain a transverse displacement, so that undesired crystal defects will not be located at critical positions. Additional current conductors, such as 40A in FIG. 1, may be arranged in a similar way as the conductors for the rotary magnetic field. A further extension is that the plate 97 is provided with a layer of magnetic material on both sides for accommodating magnetic domains. It is to be noted that the spatial uniformity of the field need not imply a strict constancy of the field in respect of time.

Figure 7:
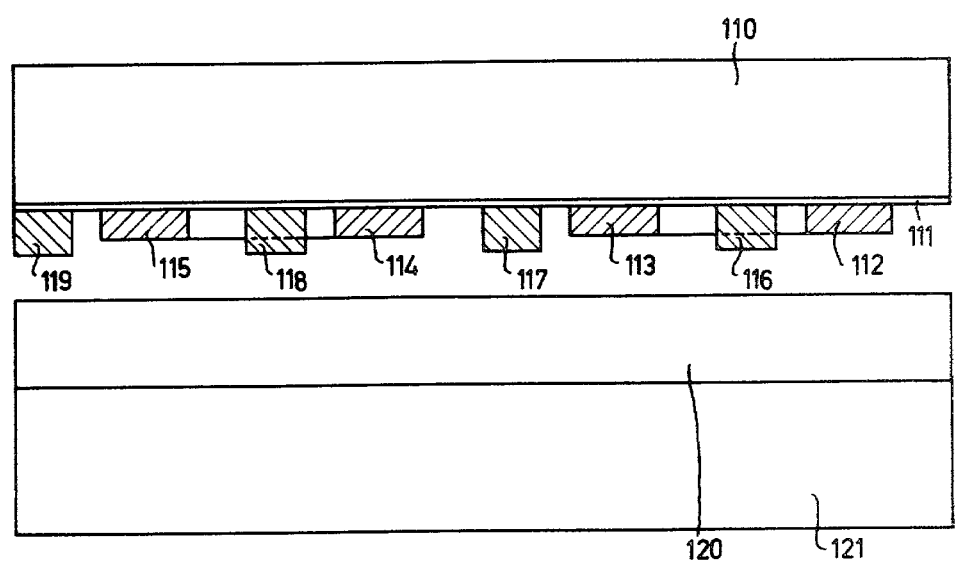

FIG. 7 is a cross-section through a current access device in accordance with FIG. 2–4, based on the foregoing. The device comprises a silicon layer 110, an insulating layer 111, a layer of magnetic material 120 and a reinforcing substrate layer 121. A meander conductor is provided, which intersects the plane of the drawing in four points. The cross-sections (112–115) are shown hatched. Furthermore, it intersects four permalloy elements (116–119). Behind the permalloy elements 116, 118 a side view of the meander conductor is visible. Consequently the cross-section extends along a path for magnetic domains. The advantages mentioned with reference to FIG. 5 are also valid in this case in respect of the use of the silicon plate. Although in the case that such meander conductors are used the maximum attainable bit frequency is a less problematical limit, the dissipation in this case is also an approximately linear function of the frequency. Temperature problems will therefore arise only at a higher temperature when silicon is used. A cross-section of a device in accordance with FIG. 4 has a similar structure as in the example of FIG. 7, but without ferromagnetic elements. Between the layer 120, and the permalloy elements and the current conductors respectively a spacer layer may be provided, known per se, having a thickness of for example ¼ micron.

Figure 8:
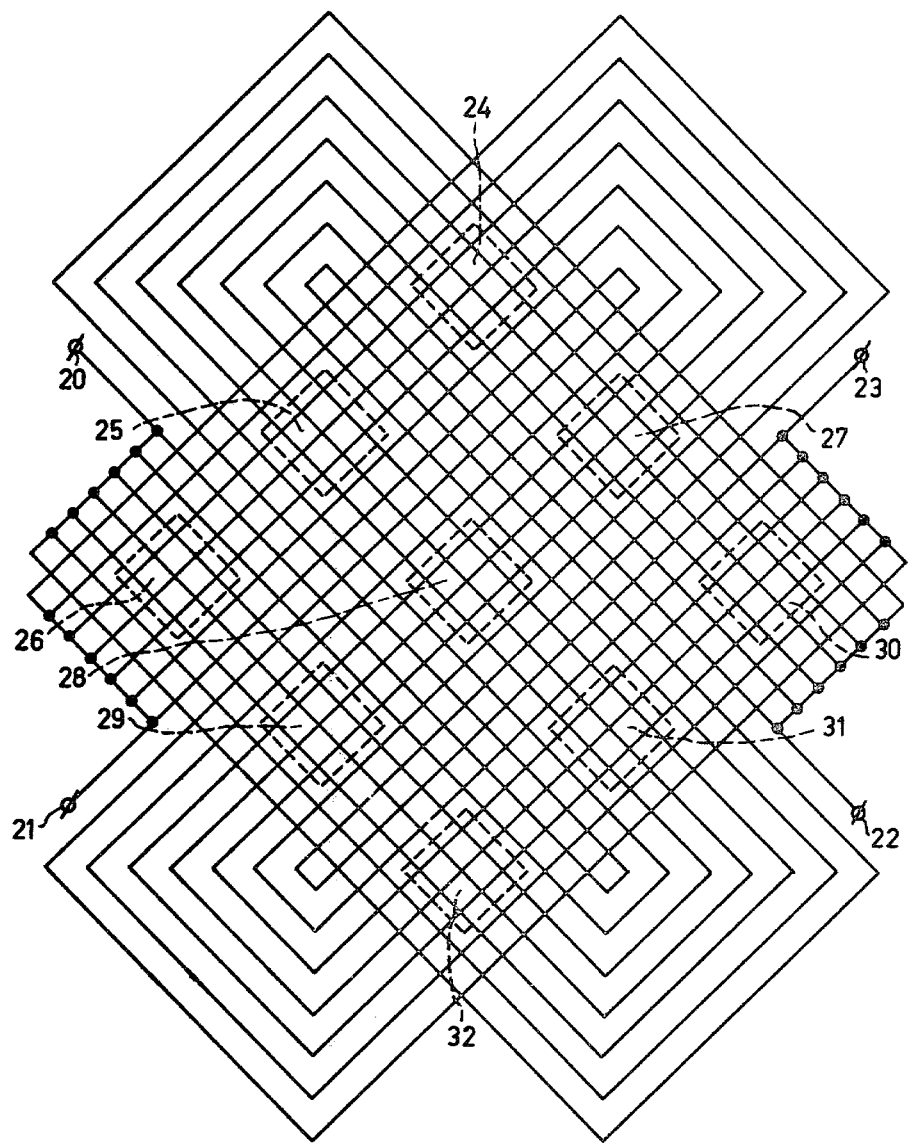
FIGS. 8 and 9 show two different arrays of current conductors according to the invention.

FIG. 8 shows a first arrangement of current conductors according to the invention for use in a field access device. The connections 20–23 are to be connected to a source of sinusoidal currents, which source is not shown for the sake of simplicity. In the arrangement shown the current conductors are arranged in two groups of seven, which extend substantially parallel and in accordance with rectangular patterns. A number other than seven may be selected. The number of periods of the pattern, which in the present example is one and a half, may also vary. Electrically, the groups of seven current conductors are connected in parallel. However, they may also be separated or connected in series. They all have the same length owing to their arrangement in a rectangular pattern. In an elementary case they may carry equal currents. On the other hand, through special dimensioning, it is possible to ensure that, for example, the outermost current conductors of a group carry a higher current. This can be achieved by increasing the width of the conductor track and thus reducing the intervals between adjacent conductor strips at constant track thickness and center-to-center distance. Thus, the uniformity of the magnetic field can be improved in the areas which are shown hatched. In these working regions the magnetic fields are homogeneous along the layers of the conductors and at a suitably selected distance therefrom. When the two groups of conductors are driven by, for example, sinusoidally varying currents with a mutual phase shift of 90°, substantially constant rotary magnetic fields are produced in the dotted areas for energizing an arrangement in accordance with FIG. 1. The phase and sense of rotation in the areas 24, 26, 30, 32 then correspond to each other. In the area 28 the sense of rotation is the same, but there is a 180° phase shift. In the areas 25, 27, 29, 31 the sense of rotation is possible that of areas 24, 26, 28, 30, 32. Areas 25, 31 are 180° out of phase as compared to areas 27, 29. The plates with the magnetic bubbles may be arranged in the active areas. The embodiment shown is merely an example. The homogeneity of the magnetic fields improves as the width of a group of mutually parallel current-carrying conductors increases. In that case a comparatively larger portion of the surface area can be used. The percentage of this portion may rise to approximately 100%. Between the active areas 24–32 a direction reversal occurs for at least one of the two field components.

Figure 9:
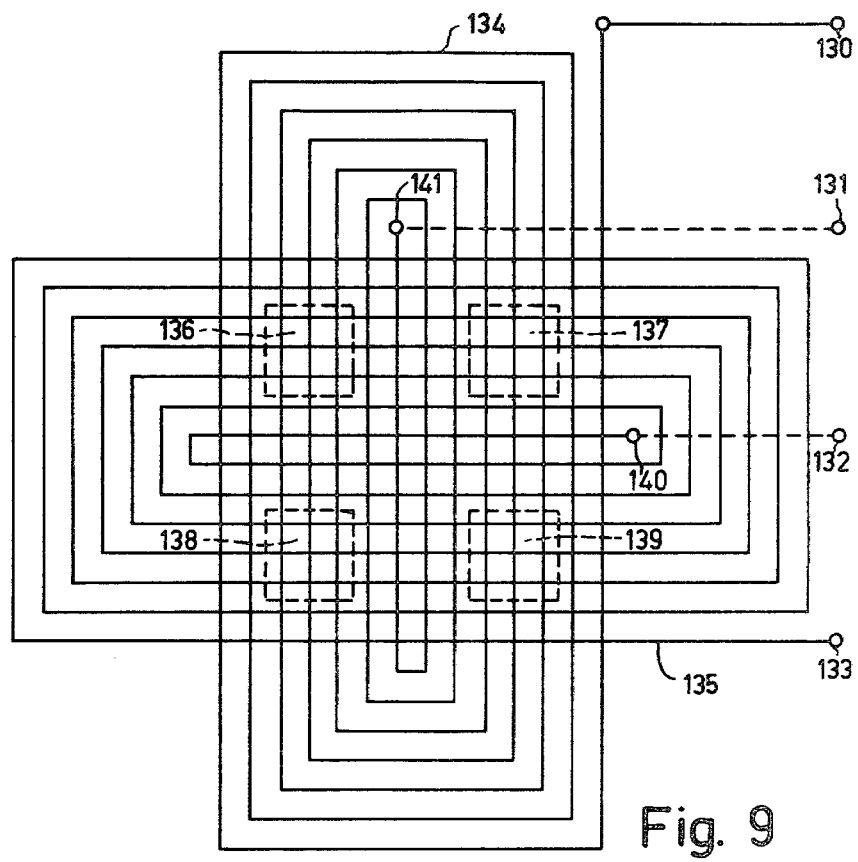

FIG. 9 shows a second arrangement of current conductors (134, 135) which each constitute a rectangular spiral with connections 130-133. When double-layer wiring is employed, the connections, shown dotted, constitute the "other" layer. In the active areas 136–139 the external field is satisfactorily homogeneous. The sense of rotation is the same for each of the pairs 136, 139 and 137, 138 respectively but with a 180° phase shift per pair. In this case the relative utilization of the surface area may also be improved, but it can only be improved to approximately 40%.

Figure 10:
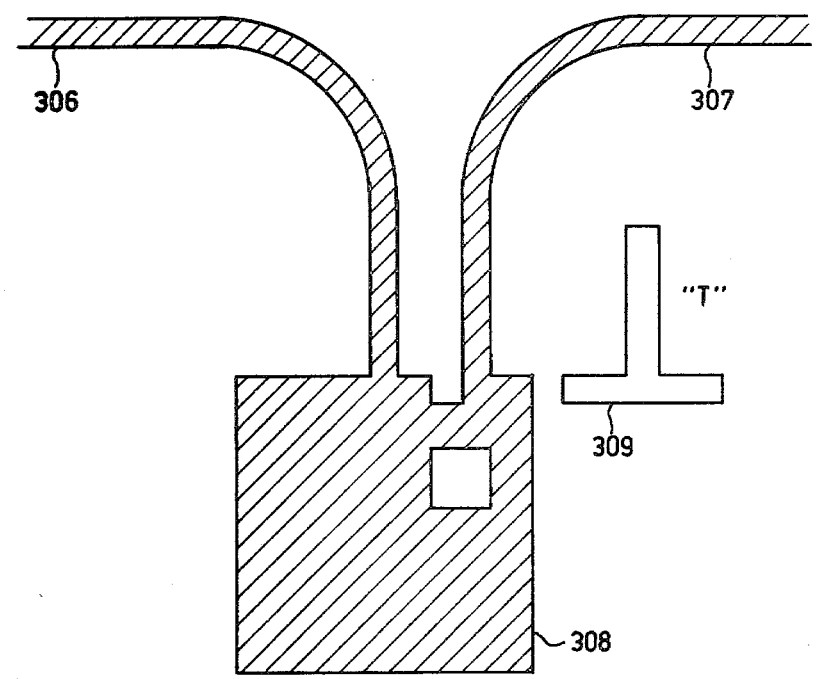
FIG. 10 shows a domain generator element.

FIG. 10 shows a current-controlled generator element for domains, which is entirely realized in permalloy. It is suitable for field access of the domains. The sense of rotation of the magnetic field is counterclockwise. A parent domain is continuously present on the source element 308. It can be split during every period of the rotary magnetic field when the series connection of the elements 306, 308, 307 receives a current pulse. The split-off domain is discharged. Such a generator element may be arranged on a silicon plate, as previously mentioned, the heat developed being readily removable. A switching element for domains can be accommodated on a silicon plate with the same technology. A current controlled switching element is known per se from an article by M. S. Cohen et al, (IEEE Transactions on Magnetics, Vol. MAG. 13, No. 5, September 1977, pp. 1264–1266) which shows a Y-bar switch.

Figure 11:
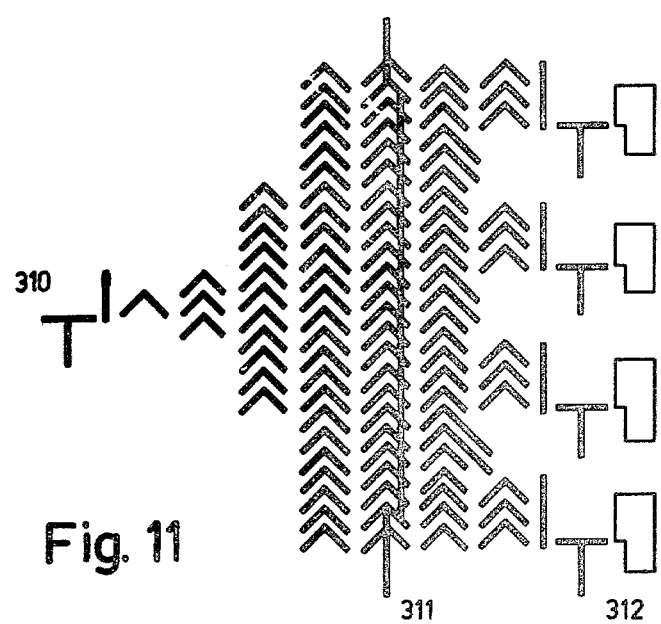
FIG. 11 shows a detector element.

FIG. 11 shows a magnetically operating domain detector element. At 310 the input of said detector is connected to a path consisting of T and I-elements. A domain which arrives there is extended along the consecutive chevron strips and ultimately influences the electrical resistance of the interconnected chevron path 311. Finally, the domain is split up and destroyed in the parallelly-connected annihilators near 312. This detector element may also be accommodated on a silicon plate. The heat developed by the detector current is then readily carried off in the plate.

Figure 12:
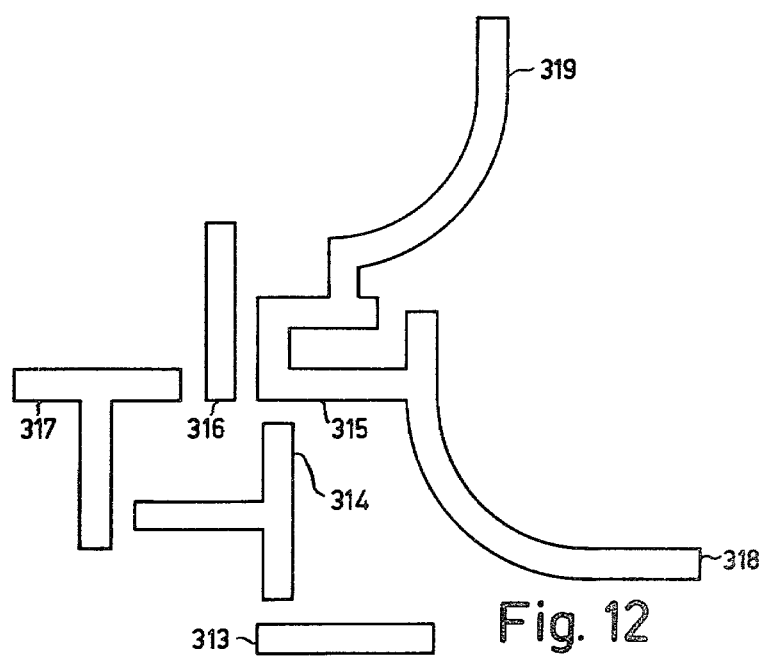
FIG. 12 shows a destruction element.

FIG. 12 represents a destruction element for magnetic domains. Driven by a field with a counterclockwise sense of rotation the domains arrive at the element 313 and pass the sequence of permalloy elements 313-317. If the series connection of the elements 318-315-319 is energized by a current pulse at the transition between the elements 314 and 315, the domain is destroyed. Thus, information can be applied selectively to an uninterrupted flow of domains. The entire arrangement of FIG. 12 may be realized in permalloy and accommodated on a silicon plate, so that the heat which is developed can readily be carried off.

Figure 13:
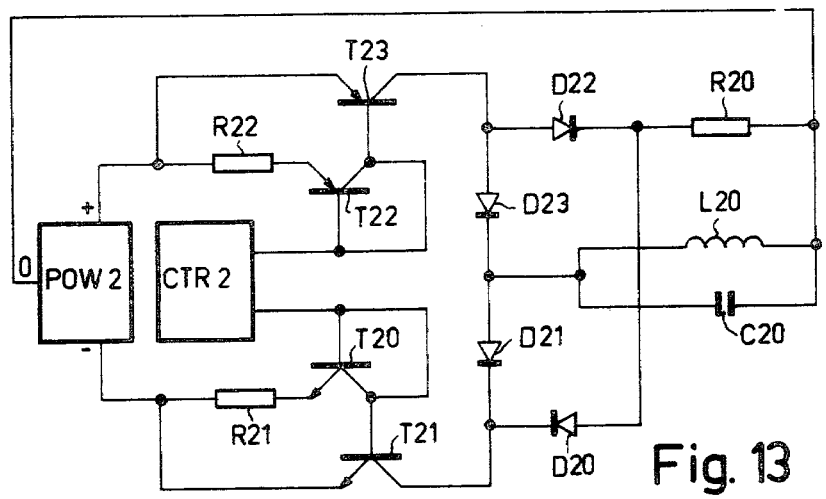
FIG. 13 shows a current pulse generating circuit.

FIG. 13 shows a circuit arrangement for generating current pulses, for example for energizing one of the sets of windings for the rotary magnetic field, which arrangement is known per se from U.S. Pat. No. 4,074,199. On the other hand, such a circuit or a simplified version thereof may be employed to energize meander conductors or the loops which serve to assist in operating the domain generators (see FIG. 1), domain annihilators and switching elements. It is alternatively possible to employ other circuit arrangements, so that the present version is merely presented by way of example. The circuit may be integrated partly or completely on a silicon plate together with the conductor(s) controlled by it, in accordance with techniques which are known per se and which are not described in more detail. The circuit comprises a direct current supply POW2, a control device CTR2, four transistors T20, T21, T22, T23, a coil L20 as an example of a conductor or conductor set to be energized, a capacitor C20, four diodes D20, D21, D22, D23, and three resistors R20, R21, R22. It is first of all assumed that the transistor T21 is continually cut off. The base current of transistor T23 (to CTR2) now drives the transistor T23 into conduction, so that a current source with high internal resistance is formed. When the transistor T23 is now turned off by a control signal from the control device CTR2 the current through the coil L20 decreases in accordance with a cosine function, initially slowly and then progressively faster. The energy of the coil is then stored in the capacitor C20. The voltage across the capacitor then changes polarity and can become substantially higher than in the stationary condition. Diode D23 remains on, but diode D22 is turned off. The transistor T23, however, remains cut off. In the second quarter period the current in the coil is reversed. When the tuned circuit consisting of L20 and C20 exhibits only low losses, it attains substantially its original absolute value. The voltage on capacitor C20 has then virtually disappeared. In the third quarter period the current decreases again and the voltage across the capacitor increases, but with the same sign as in the stationary case. However, diode D23 is now cut off. In the fourth quarter period the current in the coil increases again and substantially reaches its original magnitude and direction. During the second half period (diode D23 is then cut off) transistor T23 can be turned on again by a further control current signal. If subsequently the voltage across the capacitor C20 resumes its original polarity the current through the transistor T23 can be superimposed on the oscillating current in the tuned circuit. As a result of this, the two diodes D22, 23 can be turned on, so that the resistor R20 now forms part of the parallel-tuned circuit. When this resistor has a value: $R20 = \frac{1}{2}\sqrt{L20/C20}$ the tuned circuit is critically damped and no decay effects occur after one period. As a result of this, a following period can be started shortly after the first period, the current levels still being dictated by the controllable current source arrangement. When the losses are low, the circuit may also perform for example 2 periods, in that the transistor T23 is not turned on again until the fourth half cycle. The tolerance in respect of the instant that transistor T23 is turned on again is approximately half a period of the natural frequency of the tuned circuit. When the device is at rest for a prolonged time, the current in the coil L20 may be attenuated or even cut off completely by a changed control signal.

The bidirectional circuit may also be operated with transistor T23 continually cut-off and transistor T21 each time being turned on for a time which lies between one half and one whole period of the natural frequency of the tuned circuit. Furthermore, transistor T23 may initially be conductive and transistor T21 cut off. Transistor T23 is then also turned off by a first control current signal, so that a first half period of the oscillation is started. If the transistor T21 is now turned on by a second control current signal within a half period, only one half period is performed. Transistor T21 takes over conduction. The first and the second control current signals may appear simultaneously. By providing both sets of conductors in FIGS. 8–9 with such a generator, the rotary magnetic field can either be made to rotate or maintained in a specific orientation.

Figure 14:
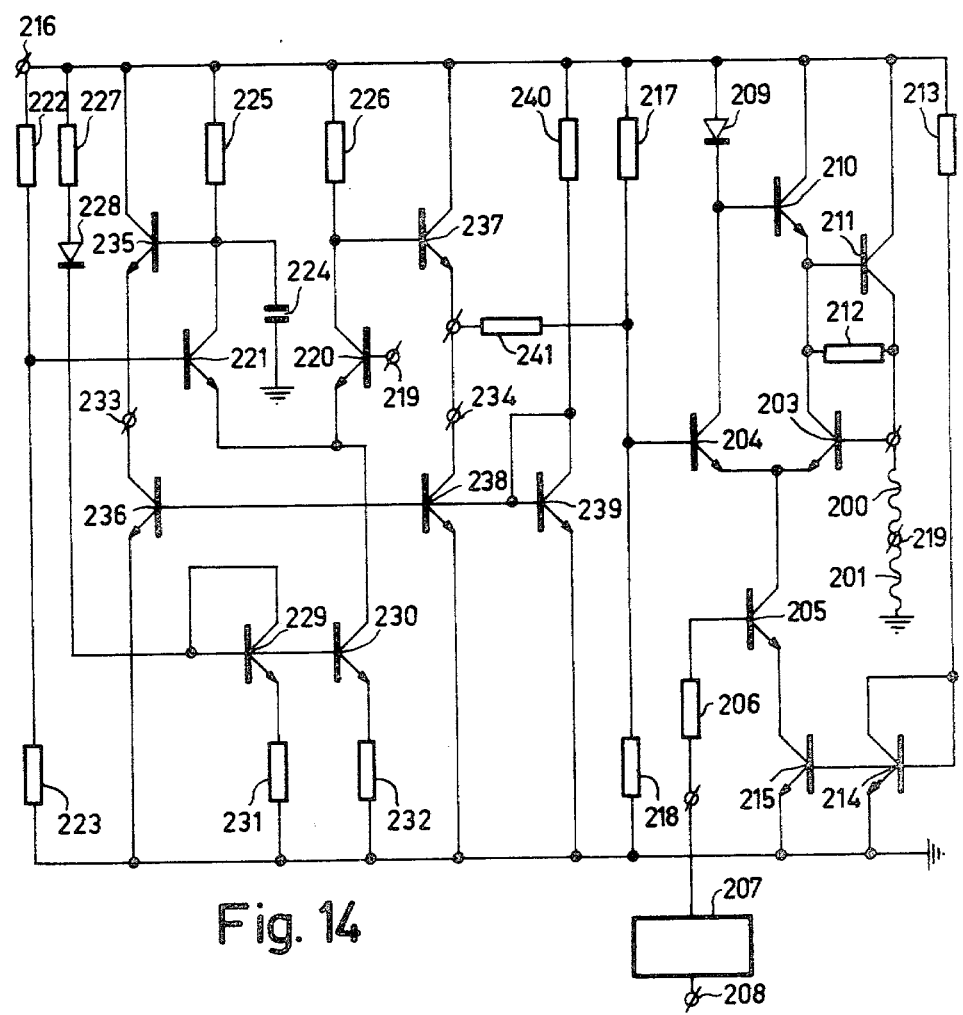
FIG. 14 shows a domain information processing device.

FIG. 14 shows a part of an information processing device to be used in conjunction with a domain device in accordance with the invention. In an arrangement in accordance with FIG. 1 the domains are applied to a chevron detector in accordance with FIG. 11. Two of such detectors 200, 201 are schematically shown in FIG. 14. They are arranged as application Ser. No. 827,854, filed Aug. 26, 1977, in order to compensate for disturbance produced in the conductor by the rotary magnetic field. The transistors 203, 204 constitute an amplifier with a gain of unity. A plurality of such amplifiers are connected in parallel so as to receive signals from an equal number of the domain detector pairs. Only one of these is selected by a signal on input 208 (for example a binary code) by means of the decoder 207, resistor 206 (2000 ohms) and transistor 205. The amplifier furthermore includes the diode 209, the transistors 210, 211 and the resistor 212 (4400 ohms). The plurality of amplifiers furthermore have resistor 213 (3800 ohms) and transistors 214, 215 in common. Terminal 216 is at a supply voltage of for example 6.25 volts and by means of the resistors 217 (1500 ohms) and 218 (1000 ohms) a so-called "double reference voltage" for the amplifiers is derived therefrom and applied to the base electrode of transistor 204 in the Figure. The center tapping between the domain detectors 219 is connected to the base electrode of transistor 220. This transistor (not shown for simplicity) is included as many times as there are amplifiers (203/204). Selection of the relevant transistor is effected intrinsically by the detection signal itself. Transistor 220 and transistor 221 (which is common to all transistors 220) are then again connected as a long-tailed pair. By means of resistor 222 (4000 ohms) and resistor 223 (1000 ohms) it is ensured that the base electrode of transistor 221 now carries the so-called "single reference voltage". Capacitor 224 serves to balance the long-tailed pair for the collector-base capacitance of the additional transistors 220. The last-mentioned transistor pair is biased by two resistors 225, 226 (approximately 2866 ohms), resistor 227 (2300 ohms), diode 228, transistors 229, 230 and resistors 231, 232 (36 ohms each). The output signals of the second long-tailed transistor pair appear on terminals 233 and 234 respectively, and are applied to these terminals by means of the transistors 235, 236, 237, 238, 239 and resistor 240 (4200 ohms). By means of resistor 241 (2700 ohms) feedback is provided between the transistor pairs 203/204 and 220/221. This circuit provides common-mode rejection and furthermore realizes a gain of 5×. The input signal on decoder 207 may be accompanied by the processing of the output signal, it may for example also act as an access signal for a foreground memory which is also integrated on the silicon plate, for which the domain memory serves as background memory. The decoder and any further devices may also be integrated. The last-mentioned devices are not shown for simplicity.

What is claimed is:

1. A magnetic domain device comprising:
   a plate of magnetic material;
   means for generating a magnetic field extending transversely in said plate of magnetic material for sustaining magnetic domains therein;
   at least one current conductor under the control of a current therein for simultaneously producing a plurality of preferred positions for said magnetic domain in said plate of magnetic material and, under control of a sequence of currents in said current conductor, producing a continual sequence of preferred positions for domains thereby determining a domain path;
   a silicon plate positioned at least substantially parallel to said plate of magnetic material;
   an insulating layer at least partly covering the silicon plate;
   wherein at least a part of said current conductor is structurally joined to said insulating layer so as to carry off heat which is developed by said current in said conductor through heat transfer to and heat conduction in said silicon plate.

2. A device as claimed in claim 1 wherein said insulating layer comprises $SiO_2$.

3. A device as claimed in claim 2, wherein said part of said current conductor comprises a substantially meander-shaped section for amplifying and attenuating a bias magnetic field in alternating meander loops resulting from an electrical current flowing therein, for driving magnetic domains along a path which extends at least partly along the meander-shaped current conductor.

4. A device as claimed in claim 2, wherein said silicon plate contains a two-dimensional area in which there are arranged a plurality of current conductors which are at least substantially parallel to each other and which are structurally joined with the insulating layer for generating a substantially uniform magnetic field, with an orientation which is at least substantially parallel to and in said plate of magnetic material at the location of said two-dimensional area, by means of coexistent and equally directed currents in said conductors.

5. A device as claimed in claim 4, wherein said silicon plate comprises two sets of current conductors within said two-dimensional area which conductors are at least substantially parallel to each other and are structurally combined with the silicon plate, said two sets being arranged crosswise relative to each other for generating a substantially spatially uniform rotary magnetic field in the plate of magnetic material at the location of said two-dimensional area by means of time-dependent electric currents in the respective sets.

6. A device as claimed in claim 2, wherein said silicon plate comprises a first two-dimensional area in which there is arranged a first plurality of current conductors which are at least substantially parallel to each other and which are structurally joined with said insulating layer, the device also including a second silicon plate having a second two-dimensional area in which there is arranged a second plurality current conductors on an insulating layer which are at least substantially parallel to each other and which are structurally joined with said second silicon plate, the size and location of the first and the second two-dimensional areas and said first and second pluralities, and the directions of said first and second pluralities of current conductors correspond for generating a substantially spatially uniform magnetic field which is oriented substantially parallel to and in said plate of magnetic material, which plate is disposed between said two plates of silicon, at the location of said two-dimensional areas by means of coexistent currents which are equally directed within the first and within the second plurality, the directions of the currents in the one plurality being opposed to those of the currents in the other plurality.

7. A device as claimed in claim 6, wherein said plates of silicon, within said first and second two-dimensional areas respectively, each comprise two sets of current conductors which are at least substantially parallel to each other and which are structurally joined with the associated silicon plate by way of insulating layers, which two sets are each arranged cross-wise relative to each other so as to generate a substantially spatially uniform rotary magnetic field in the plane of the first plate of magnetic material at the location of said two-dimensional means of time dependent currents in the respective sets, the fields of the two sets of current conductors each time cooperating at the location of the plate of magnetic material.

8. A device as claimed in claim 5, wherein at least said silicon plate comprises two sets of conductors which locally cross each other in at least two locations so as to generate rotary magnetic fields with mutually different senses of rotation in the plate of magnetic material and at the location of the crossings by means of time-dependent currents in said sets.

9. A device as claimed in claim 2, wherein said plate of magnetic material includes a two-dimensional area for accommodating a group of magnetic domains which are regularly arranged in accordance with matrix axes, said part of the current conductor comprising at least two sections which extend parallel to the first matrix axis for driving at least one subgroup of said group, which subgroup is disposed between said sections in a direction transverse to said first matrix axis by the sequence of said currents in the sections.

10. A device as claimed in claim 9, wherein said group constitutes a bubble lattice utilizing repellent forces between adjoining bubbles.

11. A device as claimed in claim 10, including magnetically operating means in the form of elements of a ferromagnetic material for the formation of preferred domain positions thereon in conjunction with said currents, said elements being structurally joined with said silicon plate by way of the insulating layer.

12. A device as claimed in claim 2, wherein the plate of magnetic material is substantially monocrystalline.

13. A device as claimed in claim 2, wherein the plate of magnetic material is a polycrystalline material.

14. A device as claimed in claim 2, including a circuit for controlling current pulses in at least one of said current conductors, said circuit being integrated on the silicon plate.

15. A device as claimed in claim 2, including a magnetically operating detector element with an input connected to said path for magnetic domains, said detector element being structurally combined with said silicon plate by way of the insulating layer.

16. A device as claimed in claim 15, including an electrically operating detection circuit the input of which is electrically connected to an output of said detector element for supplying a detection signal to an electrical output of the detection circuit, said detection circuit being structurally joined with said silicon plate as an integrated circuit which is formed on said plate.

17. A device as claimed in claim 2, wherein said current conductor comprises a current loop of a domain generator element, which loop is structurally combined with the silicon plate by way of the insulating layer.

18. A device as claimed in claim 2, wherein said current conductor comprises a current loop of a domain switching element, said loop being structurally combined with the silicon plate by way of the insulating layer, for selectively driving a domain to one of at least two path branches which issue from said element.

19. A device as claimed in claim 2, wherein said current conductor includes a current loop of a domain destruction element, which loop is structurally combined with the silicon plate by way of the insulating layer.

20. A device as claimed in claim 2 including an information processing device for the processing of domain information structurally combined with said silicon plate as an integrated circuit formed on said plate, and an information connection between a terminal of the information processing device and a device for access to a magnetic domain path.

* * * * *